(12) United States Patent
Tanaka

(10) Patent No.: US 7,141,177 B2
(45) Date of Patent: Nov. 28, 2006

(54) ETCHING METHOD AND COMPOSITION FOR FORMING ETCHING PROTECTIVE LAYER

(75) Inventor: Hatsuyuki Tanaka, Shizuoka (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 10/487,658

(22) PCT Filed: Sep. 4, 2002

(86) PCT No.: PCT/JP02/08962

§ 371 (c)(1),
(2), (4) Date: Feb. 23, 2004

(87) PCT Pub. No.: WO03/025677

PCT Pub. Date: Mar. 27, 2003

(65) Prior Publication Data

US 2004/0238486 A1 Dec. 2, 2004

(30) Foreign Application Priority Data

Sep. 13, 2001 (JP) .............................. 2001-277600

(51) Int. Cl.
*B44C 1/22* (2006.01)
(52) U.S. Cl. .............................. 216/41; 216/47; 430/5; 430/313; 430/327; 438/780
(58) Field of Classification Search ................ 216/41, 216/47; 430/207.1, 327, 5, 313; 438/780
See application file for complete search history.

(56) References Cited

U.S. PATENT DOCUMENTS

| | | | |
|---|---|---|---|
| 3,666,473 A | 5/1972 | Colom et al. | |
| 4,812,551 A * | 3/1989 | Oi et al. | 528/129 |
| 5,538,820 A | 7/1996 | Fisher | |
| 5,547,812 A | 8/1996 | Collins et al. | |
| 5,858,620 A | 1/1999 | Ishibashi et al. | |
| 6,319,853 B1 | 11/2001 | Ishibashi et al. | |

FOREIGN PATENT DOCUMENTS

| | | |
|---|---|---|
| CN | 1222756 A | 7/1999 |
| CN | 1232550 A | 10/1999 |
| EP | 1152036 | 11/2001 |
| EP | 1223470 | 7/2002 |
| JP | 10-73927 | 3/1998 |
| JP | 10-120968 | 5/1998 |
| JP | 11-204399 | 7/1999 |
| JP | 11-283910 | 10/1999 |
| JP | 2001-19860 | 1/2001 |
| JP | 2001-109165 | 4/2001 |
| WO | WO 98/14832 A1 | 4/1998 |

OTHER PUBLICATIONS

H. Ito and C. G. Wilson, Polymer Engineering and Science, vol. 23, No. 18, pp. 1012-1018 (Dec. 1983).
W.E. Feely, J.C. Imhof and C.M. Stein, Polymer Engineering and Science, vol. 26, No. 16, pp. 1101-1104 (Mid-Sep. 1983).
Official Action (in Chinese and English Translation thereof) from State Intellectual Property Office of P.R. China for Application No. 02817955.2.

* cited by examiner

*Primary Examiner*—Shamim Ahmed
(74) *Attorney, Agent, or Firm*—Alan P. Kass

(57) ABSTRACT

This invention offers a method to improve-etching resistance of etching mask upon etching comprising steps of forming a pattern on a substrate by using photoresist, applying a composition for forming an etching protection layer containing water-soluble or water-dispersible resin, crosslinking agent and water and/or water-soluble organic solvent as a solvent, forming etching protection layer which is insoluble in a developer containing water in the interface between a composition for forming an etching protection layer and a photoresist by heating, removing by a developer unnecessary area excluding etching protection layer made of a composition for forming an etching protection layer, and treating a substrate by etching using photoresist pattern as a mask.

17 Claims, No Drawings

ETCHING METHOD AND COMPOSITION FOR FORMING ETCHING PROTECTIVE LAYER

This application is a United States National Stage Patent Application under 35 U.S.C. § 371 of International Patent Application No. PCT/JP02/08962, filed Sep. 4, 2002, which claims priority to Japanese Patent Application No. 2001-277600, filed Sep. 13, 2001.

TECHNICAL FIELD

The present invention relates to an etching method of a substrate, etching resistance of which is improved using an etching mask made of a resist, and a composition for forming an etching protection layer used therefor. More in detail, the present invention relates to an etching resistance improving method of an etching mask that is used in manufacture of a semiconductor device, formation of a liquid crystal display device of a liquid crystal display (LCD) panel, manufacture of a circuit substrate such as a thermal head, an etching treatment method of a substrate using this etching mask, etching resistance of which is improved, and a composition for forming an etching protection layer which is used for improving etching resistance of a resist pattern.

BACKGROUND ART

In various fields including manufacture of a semiconductor integrated circuit such as LSI, formation of a liquid crystal display device of a liquid crystal display (LCD) panel, manufacture of a circuit substrate such as a thermal head etc., photolithography technology has so far been employed for forming microelements or conducting fine processing. In the photolithography technology, a positive or negative-working photoresist has been used to form a resist pattern and a radiation sensitive resin composition containing an alkali-soluble resin and a radiation sensitive resin composition comprising a quinone diazide compound is well-known as a positive-working photoresist. This composition is disclosed as "Novolak resin/quinone diazide compound" having various formations in many examined patent publications or unexamined patent publications such as Japanese examined patent publication No. Sho 54-23570 (U.S. Pat. No. 3,666,473) and other technical literatures. This kind of photoresist is applied on a silicon substrate, a substrate coated with a film of a metal such as aluminum, molybdenum, and chromium or a substrate coated with a film of a metal oxide such as ITO by the publicly known method such as a spin coat method, a roll coat method, a land coat method, a spray coat method, a dip-coat method to form a thin film, and then a circuit pattern etc. are irradiated using a radiation such as ultra-violet light as an exposure source through a mask pattern. After the exposure to light, a development is conducted to form a resist pattern. Further a fine processing can be made by etching a substrate through this resist pattern as a mask. In this etching process, a resist pattern that performs as a mask requires a sufficient etching resistance.

On the other hand, micronization of wiring width and separation width is further required in the production process recently as a semiconductor device is being highly integrated. In order to respond to this, a process using short wavelength light source which is effective for a high micronization is proposed and partially utilized practically for a light exposure equipment, i.e. a process using deep ultra violet light such as KrF eximer laser (248 nm) and ArF eximer laser (193 nm), further X-ray and electron beams as exposure light source. As the light source is getting in the short wavelength tendency, the material with no absorption in wavelength region to be applied is required for a composition of aforementioned photoresist and, for example, the material such as a chemically amplified type resist based on para-hydroxystyrene is taking a leading position for KrF light source. These kinds of polymer have the problems that they have less etching resistance than the aforementioned novolak resin in general and require etching condition, particularly etching selective ratio between a resist film layer and a layer to be etched, i.e. optimization of etching speed in each layer (to be slowed for a resist and to be fast for an etched layer) and further a deterioration of a pattern-transferred form after etching takes place. Furthermore in order to realize a micronization, a mean to make the resist film thickness thinner upon coating and exposing to light, the aforementioned chemically amplified resist is being used. This makes the etching process more difficult. When using ArF eximer laser light source, acrylic polymers are being proposed wherein an aliphatic cyclic compound is introduced as a material which is transparent to the wavelength used for exposure to light. These polymers were deemed to be further low etching-resistant and made manufacture of a semiconductor device more difficult.

Further, a method to make a resist pattern practically fine using pattern forming equipment so far publicly known are studied. For example in Japanese unexamined patent publication No. Hei 10-73927, a process is described wherein a pattern is formed by the method so far known using a radiation sensitive resin composition so far applied, then a layer is applied on the resist pattern formed, acid generated in a resist by heating and/or exposure to light or acid existing in a resist is diffused into the aforementioned coated layer, the coated layer is crosslinked or hardened by this diffused acid and the resist pattern is made thicker by removal of uncrosslinked coated layer to make the width between resist patterns narrower as a result, to realize the micronization of resist pattern by decreasing separation size or hole diameter and form a fine resist pattern having a higher resolution than the limit of resolution so far known practically. However, it is not mentioned in the patent publication to improve an etching resistance of a resist.

Under the circumstances described above, an object of the present invention is to offer a method to improve etching resistance of a photoresist pattern that is formed by the method so far applied and a method to etch a substrate using the resist pattern as an etching mask, the etching resistance of which is improved.

DISCLOSURE OF THE INVENTION

As a result of eager study and examination, the present inventors found that the aforementioned object can be attained by forming additionally an etching protection layer having etching resistance on a photoresist pattern and reached to the present invention.

That is, the present invention relates to an etching method of a substrate which comprises steps of forming a resist pattern on a substrate using a photoresist, applying a composition for forming an etching protection layer on the resist pattern formed, forming an etching protection layer which is insoluble in a developer containing water in the interface between the composition for forming an etching protection layer and the photoresist described above, removing unnecessary parts other than an etching protection layer of the aforementioned composition for forming an etching protection layer by a developer containing water and etching a substrate by using a resist pattern having aforementioned etching protection layer thereon as a mask.

The present invention also relates to a composition for forming an etching protection layer used for aforementioned etching method that is characterized in that it contains a water-soluble or a water-dispersible resin, a crosslinking agent and water as a solvent and/or a water-soluble organic solvent.

Hereinafter, the present invention will be described in more detail.

In the etching method of the present invention, a resist pattern which consists of a photoresist film is formed on a substrate. Methods to form the resist pattern and materials used in these methods such as a photoresist, a developer, etc. may be anything, by which a resist pattern consisting of a photoresist can be formed on a substrate. As a photoresist, there are exemplified positive or negative-working photoresists which have been used so far to form a resist pattern, for example a composition comprising alkali-soluble resin such as a novolak resin and a naphthoquinone diazide photosensitizer or a chemically amplified type resist as representative ones. In the chemically amplified type photoresist, a lot of positive-working compositions are known such as a composition comprising a combination of a polymer consisting of polyhydroxystyrene protected with t-butoxycarbonyl group and a photo acid generator (H. Itoh, C. G. Willson: Polym. Eng. Sci., 23, 1012 (1983) to be referred) etc. A negative-working chemically amplified type photoresist can be exemplified with a composition comprising an alkali-soluble resin, hexamethoxy melamine as a crosslinking agent and a photo acid generator (W. E. Feely, J. C. Imhof, C. M. Stein, T. A. Fisher, M. W. Legenza: Polym. Eng. Sci., 26, 1101 (1986) to be referred). Of these, a positive-working chemically amplified type photoresist is inferior in etching resistance usually to a negative-working chemically amplified type photoresist. The etching resistance of the positive-working chemically amplified type photoresist can be favorably improved by the present invention. The film thickness of a photoresist is usually made to be 0.3 to 1.0 μm or like as a resist pattern obtained after development may be suitably responsive to etching in an etching process.

In order to form a resist pattern which is made of a photoresist film on a substrate, a photoresist is applied by the publicly known method such as a spin coat method, a roll coat method, a land coat method, a spray coat method, a dip-coat method, etc. on a silicon substrate having optionally a silicon oxide film on the surface, a substrate coated with a film of a metal such as aluminum, molybdenum, and chromium, a substrate coated with a film of a metal oxide such as ITO and a substrate on which a circuit pattern or a semiconductor device is additionally formed to form a thin photoresist film, the coated film is baked (for example, baking temperature of 70 to 140° C. and baking time of about 1 minute) if necessary, then circuit pattern-wise irradiation or the like is conducted to the resist film through a mask for exposure to light such as a reticle. As the light source used for exposure to light, any light sources can be used if a photoresist show the sensitivity to the light. Ultra violet light such as g-line, i-line, deep ultra violet light such as KrF eximer laser light, ArF eximer laser light, X-ray, electron beams, etc. can be raised as a light exposure source. A resist film exposed to light is post-exposure-baked (PEB) if necessary (for example, baking temperature: 50 to 140° C.), developed, and optionally baked after development (for example, baking temperature: 60 to 120° C.), to form a resist pattern. As a developer, any developer can be applied which can develop the used photoresist. A developer consisting of an alkaline aqueous solution is usually used in the case using a photoresist comprising an alkali-soluble resin and a naphthoquinone diazide photosensitizer or a chemically amplified resist as a photoresist. Furthermore, as a developing method, any method can be adopted which is used for a development of a photoresist so far applied such as a paddle development.

A composition for forming an etching protection layer is applied on the substrate having a resist pattern formed in such way. As a coating method, there may be used any method so far applied when a photoresist is coated such as a spin coat method, a spray coat method, a dip-coat method, a roller coat method, etc. In order to form an etching protection layer which is insoluble in a developer containing water in an interface between said composition for forming an etching protection layer and the resist, the resist pattern and the composition for forming an etching protection layer are heated up. Thereby a crosslinked layer is formed in a film for forming an etching protection layer neighboring with the resist pattern and an etching protection layer is formed. This formation of the etching protection layer may be conducted, for example, by crosslinking or hardening a composition for forming an etching protection layer by acid diffusion through heating from a photoresist to a film for forming an etching protection layer.

A composition for forming an etching protection layer used in the present invention comprises at least a water-soluble or water-dispersible resin, a crosslinking agent and water and/or a water-soluble organic solvent and one which does not dissolve a resist pattern when coated thereon is used. As said water-soluble or water-dispersible resin composing a composition for forming an etching protection layer, any publicly known one can be applied if it is a water-soluble or water-dispersible resin. For example, a homopolymer or a copolymer is raised which is formed by homo- or co-polymerizing at least one monomer component selected from the group consisting of acrylic acid, methacrylic acid, vinyl acetal, vinyl alcohol, ethylene imine, ethylene oxide, styrene, a styrene derivative such as hydroxystyrene, a polycyclic aromatic vinyl compound, a heterocyclic vinyl compound, vinyl amine, allyl amine, vinyl methyl ether, and ethylene glycol, a water-soluble novolak resin, a water-soluble resin containing an oxazoline group, a water-soluble melamine resin, a water-soluble urea resin, an alkyd resin, sulfoneamide, etc. These may be used singly or in a mixture of two or more kinds.

A resin produced using a monomer having an aromatic ring or a heterocyclic ring as a monomer component is favorably used as a water-soluble or water-dispersible resin used for a composition for forming an etching protection layer from a view point of improving an etching resistance in the present invention. As an example of these preferable resins, a water-soluble or water-dispersible resin comprising a copolymer of at least one monomer selected from the group consisting of acrylic acid, methacrylic acid, vinyl acetal, vinyl alcohol, vinyl pyrrolidone, ethylene imine, maleic anhydride, vinyl amine, allyl amine, methacryl amine and vinyl methyl ether and at least one monomer selected from the group consisting of styrene, a styrene derivative, a polycyclic aromatic vinyl compound, a heterocyclic vinyl compound, a water-soluble novolak resin, etc. can be raised.

As the styrene derivative described above, hydroxystyrene, 4-methylstyrene, 4-ethylstyrene, p-isopropylstyrene, 4-butylstyrene, 4-hexylstyrene, 4-methoxystyrene, 4-ethoxystyrene, 4-propoxystyrene, 4-butoxystyrene, 4-butoxymethylstyrene, 4-butoxycarbonylstyrene, 2,5-dimethylstyrene, 2,4,5-trimethylstyrene, 4-phenylstyrene, 4-fluorostyrene, 2,5-difluorostyrene, 2,4-difluorostyrene, o-chlorostyrene, 4-acetylstyrene, 4-bezoylstyrene, 4-bromostyrene, aminostyrene, vinyl benzoic acid, vinyl benzoic esters, etc. are raised. In the styrene derivative, α-methylstyrene and its derivatives are also included.

On the other hand, polycyclic aromatic vinyl compounds are exemplified as representative ones with vinyl naphthalene, vinyl alkyl naphthalene, vinyl anthracene, vinyl alkyl anthracene, vinyl phenanthrene, vinyl tetracene, vinyl pyrene, etc. and those compounds but replaced vinyl group with isopropenyl group. Furthermore heterocyclic vinyl compounds are exemplified with N-vinylcarbazol, N-vinylpyrrolidone, 1-vinylimidazol, 4- or 2-vinylpyridine, 1-vinyl-2-pyrrolidone, N-vinyl lactam, etc. and those compounds but vinyl group being replaced with isopropenyl group.

These water-soluble or water-dispersible resins may be used singly or in a mixture of two or more kinds. Furthermore a mixture of at least one kind selected from these resins and at least one kind selected from the group of a water-soluble resin containing an oxazoline group, a water-soluble melamine resin, a water-soluble urea resin, an alkyd resin, sulfonamide is raised as a favorable one.

These resins having aromatic or heterocyclic rings have rigidity required for an improvement of etching resistance besides they are developable with water or water-soluble organic solvent even though provided for the above purpose since they are made water-soluble or water-dispersible.

And then the molecular weight of water-soluble or water-dispersible resins is preferably 1,000 to 10,000 by weight average molecular weight, more preferably 2,000 to 5,000. The stability of a coated film depending on time is deteriorated besides its coatability is deteriorated and then it is getting difficult to obtain a homogeneous coating film if the molecular weight is less than 1,000 and the stringy phenomenon takes place or homogeneous coating film cannot be obtained with a small amount of dropping quantity since the resin is not spread on a resist surface if the molecular weight exceeds 10,000.

As a crosslinking agent used in a composition for forming an etching protection layer of the present invention, there can be raised alkoxyalkylated amino resins such as alkoxyalkylatedmelamine resins, alkoxyalkylated benzoguanamine resins, alkoxyalkylated urea resins besides low molecular melamine, guanamine and urea derivatives. These alkoxyalkylated amino resins can be exemplified with methoxymethyl melamine resins, ethoxymethyl melamine resins, propoxymethyl melamine resins, butoxymethyl melamine resins, ethoxymethyl benzoguanamine resins, methoxymethyl urea resins, ethoxymethyl urea resins, propoxymethyl urea resins, butoxymethyl urea resins, etc. Low molecular melamine, guanamine and urea derivatives are exemplified with methoxymethyl melamine, ethoxymethyl melamine, propoxymethyl melamine, butoxymethyl melamine, hexamethylol melamine, acetoguanamine, benzoguanamine, methylbenzoguanamine, monomethylolurea, dimethylolurea, alkoxymethylene urea, N-alkoxymethylene urea, ethylene urea, ethylene urea carboxylic acid, etc. These crosslinking agents can be used singly or in a mixture of two or more kinds and the incorporated quantity thereof is 1 to 70 parts by weight, preferably 10 to 50 parts by weight relative to 100 parts by weight of a water-soluble or water-dispersible resin.

Surfactants maybe added in a composition for forming an etching protection layer of the present invention in order to improve its coatability. Acetylene alcohol, acetylene glycol, polyethoxylate of acetylene alcohol, polyethoxylate of acetylene glycol, etc. can be exemplified as examples of the surfactant. Aforementioned acetylene alcohol or acetylene glycol can be exemplified by 3-methyl-1-butyne-3-ol, 3-methyl-1-pentyne-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, 2,5-dimetyl-2,5-hexanediol, etc. These surfactants can be used singly orin a mixture of two or more kinds thereof and its incorporated quantity is 50 to 2,000 ppm, more preferably 100 to 1,000 ppm in a composition for forming an etching protection layer of the present invention.

Water for dissolving or dispersing a composition for forming an etching protection layer of the present invention may not be limited particularly if it is water. Water from which organic impurities and metal ions are removed by distillation, ion exchange treatment, filtration treatment, a various kind of absorption treatment, etc. is preferable.

Furthermore a water-soluble organic solvent may be used together with water aiming at improving coatability of a composition for forming an etching protection layer. Water-soluble organic solvents may not be limited particularly if it is dissolved in water by 0.1 weight % or more, and there can be exemplified alcohols such as methyl alcohol, ethyl alcohol, isopropyl alcohol, etc., ketones such as acetone, methylethylketone, 2-heptanone, cyclohexanone, etc., esters such as methyl acetate, ethyl acetate, etc., ethylene glycol monoalkyl ethers such as ethylene glycol monomethyl ether, ethylene glycol monoethyl ether, etc., ethylene glycol monoalkyl ether acetates such as ethylene glycol monomethyl ether acetate, ethylene glycol monoethyl ether acetate, etc., propylene glycol monoalkyl ethers such as propylene glycol monomethyl ether, propylene glycol monoethyl ether, etc., propylene glycol monoalkyl ether acetates such as propylene glycol monomethyl ether acetate, propylene glycol monoethyl ether acetate, etc., lactic esters such as methyl lactate, ethyl lactate, etc., aromatic hydrocarbons such as toluene, xylene, etc., amides such as N,N-dimethylacetoamide, N-methylpyrrolidone, etc., lactones such as γ-butyrolactone, etc. and so on. Lower alcohols such as methyl alcohol, ethyl alcohol and isopropyl alcohol, ethylene glycol monomethyl ether, ethyl lactate; and N-methylpyrrolidone are raised as favorable ones. These solvents can be used singly or in a mixture of two or more kinds. Further in the case where an organic solvent used can dissolve only an uncrosslinked material for forming an etching protection layer but not dissolve a resist pattern, a solvent constituted by only organic solvent can be used as a solvent for a composition for forming an etching protection layer.

In order to form an etching protection layer in the interface between a resist pattern and the aforementioned composition for forming an etching protection layer, a coated resist pattern is heated after coating a composition for forming an etching protection layer on a resist pattern. Thereby an acid is, for example, diffused from a resist pattern to the composition for forming an etching protection layer, a crosslinking agent is activated by the function of this acid, the composition for forming an etching protection layer neighboring to the resist pattern is crosslinked or hardened, and an etching protection layer which is insoluble in a developer containing water and is excellent in etching resistance is formed. Acid in the resist pattern may be generated by heating and/or exposing to light the resist pattern, or it may be contained in the resist pattern by treating the resist pattern with an acid solution. Existence of acid in the resist pattern may be attained by the optional means. An uncrosslinked composition for forming an etching protection layer is developed and removed by a developer subsequently and then an etching mask having an etching protection layer on a resist pattern is formed.

A developer which is used for developing a composition for forming an etching protection layer may be anyone which has a sufficient solubility needed for dissolving and removing the aforementioned uncrosslinked composition for forming an etching protection layer but which cannot dissolve and remove the crosslinked protection layer. This developer includes water or a mixture of water and alcohols such as ethanol and isopropanol, organic amines such as triethylamine, organic amine salts such as tetramethylammonium salt. Of these, water and a mixture of water and alcohols are preferred. Water to be used for a developer may not be limited particularly if it is water. And water from which organic impurities, metal ions and chlorine ion are removed by distillation, ion exchange treatment, filtration treatment, a various kind of absorption treatment, etc. is preferred. It is preferred that a treatment for a removal of impurities as described above is conducted for a developer itself and then one containing no solid substance of quarter micron size or more is used as a developer for developing a composition for forming an etching protection layer.

Development of a composition for forming an etching protection layer can be made in the same way as a development method for a photoresist and by use of same developing equipment so far applied upon a development of a photoresist in the present invention. Usually the development treatment is made using a development nozzle such as a soft impact nozzle etc. by the method such as a paddle development or a shower development, and then a rinsing treatment for the photoresist is taken using pure water. In this stage, rinsing may be made with a rinsing liquid which is prepared by addition of alcohols such as ethanol and isopropanol, organic amines such as triethylamine, organic amine salts such as tetramethylammonium salt to pure water. Furthermore baking treatment may be made in order to remove water in the resist mask after development or rinsing treatment.

Etching is made using the resist pattern that is formed in the way describe above as a mask. As an etching method, there are two methods, that is, a dry etching method and a wet etching method. The dry etching method is usually applied for a formation of a finer pattern. In the dry etching method, etching is conducted using reactive gas plasma. Therefore a lot of load is put on the resist mask when the dry etching is conducted. However as an etching resistant protection layer is installed on the resist mask in the present invention, a reduction of mask film thickness is a little besides a good pattern transfer is made and the good fine processing can be made.

BEST MODE FOR PRACTICING THE INVENTION

The present invention will now be described more specifically by reference to Examples which, however, are not to be construed to limit the present invention in any way.

REFERENCE EXAMPLE 1

(Formation of a Resist Pattern)

A positive-working photoresist produced by Clariant Japan K. K., AZ 7900 (i-line resist)("AZ" is a registered trademark.) was coated on a 6 inch-silicon wafer having a oxidized film of 1 μm in thickness thereon and treated with HMDS, by a spin coater produced by Lithotech Japan Co., LARC ULTIMA-1000. The coated silicon wafer was prebaked at 100° C. for 60 seconds on a hot plate and was prepared to form a resist film of 1 μm in thickness. The film thickness was measured with the equipment for film thickness measurement produced by Dai-Nippon Screen Co. (Lambda Ace). Next it was exposed to light using a stepper having i-line (365 nm) exposure wavelength (produced by Nikon Co., NSR 1755iB, NA=0.54) by stepwise changing the exposure quantity through a reticle for a line and space pattern of 0.3 μm width. The exposed silicon wafer was heat-treated on a hot plate at 100° C. for 90 seconds. This was developed with an alkali developer produced by Clariant Japan K. K., AZ 300MIF Developer (2.38 weight % tetramethylammonium hydroxide aqueous solution) under the condition at 23° C., for 1 minute by paddle development to obtain a positive pattern.

(Preparation of Composition A for Forming Etching Protection Layer)

Each component described below was mixed at the following ratio, stirred substantially, and dissolved. After that the composition was filtrated through 0.2 μm filter to prepare a composition A for forming an etching protection layer.

| Component | parts by weight |
| --- | --- |
| Poly (vinyl alcohol) | 2.0 |
| Methoxymethylated melamine | 0.5 |
| 2-propanol | 2.5 |
| Pure water | 95.0 |

(Formation of an Etching Protection Layer)

The composition A for forming an etching protection layer was coated on the positive-working line and space pattern which was obtained as described above by spin coater produced by Lithotech Japan Co. (LT-1000), prebaked at 85° C. for 70 seconds on a hot plate to prepare as obtaining a film of 0.1 μm in thickness made from the composition for forming an etching protection layer. Furthermore the coated resist pattern was baked at 110° C. for 90 seconds on a hot plate to facilitate crosslink reaction at the neighboring area of the composition for forming an etching protection layer. After that a development treatment was made using pure water under the condition at 23° C. for 1 minute to remove uncrosslinked area and to obtain a crosslinked insoluble layer of the composition for forming an etching protection layer on the line and space pattern. Furthermore baking treatment was made at 110° C. for 120 seconds on a hot plate for drying.

(Evaluation of Etching Resistance)

The pattern with an etching protection layer thereon obtained as described above was etching-treated under the condition described below using an etcher NE-5000N produced by ULVAC Co. and the etching resistance of an etching mask was evaluated by the decreased thickness (μm) of film thickness after the etching treatment [(the initial value of resist film thickness)−(remaining film thickness after etching)] and a sectional form of an oxidized film of a substrate after etching treatment. The results were shown in Table 1.

Etching condition
Rf power: 1000 W (ISM)/300 W (Bias)
Gas flow: $CHF_3$/Ar=40/80 sccm Pressure: 0.7 Pa
Back helium temperature: −10° C.
Etching time: 200 seconds

REFERENCE EXAMPLE 2

A positive-working photoresist (KrF resist) consisting of the composition described below was coated on a 6 inch-silicon wafer having a oxidized film of 1 µm in thickness thereon and treated with HMDS, by a spin coater (Mark 8) produced by Tokyo Electron Co. The coated silicon wafer is prebaked at 90° C. for 60 seconds on a hot plate and was prepared to form a resist film of 0.7 µm in thickness. The film thickness was measured with the equipment for film thickness measurement produced by Dai-Nippon Screen Co. (Lambda Ace). Next it was exposed to light using a stepper having 248 nm exposure wavelength (produced by Canon Co., FPA3000EX5, NA=0.63) by stepwise changing the exposure quantity through a reticle for a line and space pattern of 0.3 µm width. The exposed silicon wafer was heat-treated on a hot plate at 110° C. for 90 seconds. This was developed with an alkali developer produced by Clariant Japan K. K., AZ 300MIF Developer (2.38 weight % tetramethylammonium hydroxide aqueous solution) under the condition at 23° C. for 1 minute by paddle development to obtain a positive pattern.

[Positive-working Photoresist]

| | |
|---|---|
| Copolymer of 4-hydoxystyrene and 4-t-butyloxycarbonyl styrene | 12.57 parts by weight |
| Triphenylsulfonium trifluoromethanesulfonate | 0.4 parts by weight |
| Tetramethylammonium hydroxide | 0.03 parts by weight |
| Propylene glycol monomethyl ether acetate | 87 Parts by weight |

After forming a thin film of the composition A for forming an etching protection layer on the positive-working line and space pattern which was obtained as described above in the same manner as Reference Example 1, an etching protection layer was formed in the same manner as Reference Example 1. Then it was etched in the same manner as Reference Example 1. An etching resistance of the resist mask was evaluated. The results were shown in Table 1.

EXAMPLE 1

An etching mask having an etching protection layer was formed in the same manner as Reference Example 1 except using a composition B for forming an etching protection layer prepared as described below instead of a composition A for forming an etching protection layer. This substrate having an etching mask thereon was etched in the same manner as Reference Example 1 and an etching resistance of the resist mask was evaluated. The results were shown in Table 1.

(Preparation of Composition B for Forming an Etching Protection Layer)

Each component was mixed at the following ratio, stirred substantially, dissolved. After this, the composition was filtrated with 0.2 µm filter to prepare a composition B for forming an etching protection layer.

| Component | parts by weight |
|---|---|
| Copolymer of acrylic acid and p-hydroxystyrene (85/15 molar ratio) | 2.0 |
| Methoxymethylated melamine | 0.5 |
| 2-Propanol | 2.5 |
| Pure water | 95.0 |

EXAMPLE 2

An etching mask having an etching protection layer was formed in the same manner as Reference Example 2 except using a composition B for forming an etching protection layer described above instead of a composition A for forming an etching protection layer. The substrate having an etching mask thereon was etched in the same manner as Reference Example 2 and an etching resistance of the resist mask was evaluated. The results were shown in Table 1.

EXAMPLE 3

An etching mask having an etching protection layer was formed in the same manner as Reference Example 1 except using a composition C for forming an etching protection layer prepared as described below instead of a composition A for forming an etching protection layer. The substrate having an etching mask thereon was etched in the same manner as Reference Example 1 and an etching resistance of the resist mask was evaluated. The results were shown in Table 1.

(Preparation of Composition C for Forming an Etching Protection Layer)

Each component described below was mixed at the following ratio, stirred substantially, dissolved. After this, the composition was filtrated through 0.2 µm filter to prepare a composition C for forming an etching protection layer.

| Component | parts by weight |
|---|---|
| Poly(vinyl alcohol-co-N-vinylcarbazol) (90/10 molar ratio) | 2.0 |
| Methoxymethylated melamine | 0.5 |
| 2-Propanol | 2.5 |
| Pure water | 95.0 |

EXAMPLE 4

An etching mask having an etching protection layer was formed in the same manner as Reference Example 2 except using a composition C for forming an etching protection layer described above instead of a composition A for forming an etching protection layer. This substrate having an etching mask thereon was etched in the same manner as Reference Example 2 and an etching resistance of the resist mask was evaluated. The results were shown in Table 1.

COMPARATIVE EXAMPLE 1

The substrate having a resist pattern without etching protection layer thereon which was described in Reference Example 1 was treated by etching in the same manner as Reference Example 1 and etching resistance of the resist mask was evaluated. The results were shown in Table 1.

COMPARATIVE EXAMPLE 2

The substrate having a resist pattern without etching protection layer thereon which was described in Reference Example 2 was treated by etching in the same manner as Reference Example 2 and an etching resistance of the resist mask was evaluated. The results were shown in Table 1.

TABLE 1

| | Resist species | Resist film thickness Initial value (μm) | Film thickness in non-exposed area (except pattern) Before etching (μm) | Film thickness in non-exposed area (except pattern) After etching (μm) | *Quantity of film thickness reduction (μm) | **Form of oxidized film after etching |
|---|---|---|---|---|---|---|
| Reference Example 1 | i-line resist | 1.00 | 1.06 | 0.59 | 0.41 | ⊚ |
| Reference Example 2 | KrF resist | 0.70 | 0.78 | 0.28 | 0.42 | ⊚ |
| Example 1 | i-line resist | 1.00 | 1.08 | 0.66 | 0.34 | ⊚ |
| Example 2 | KrF resist | 0.70 | 0.76 | 0.35 | 0.35 | ⊚ |
| Example 3 | i-line resist | 1.00 | 1.07 | 0.65 | 0.35 | ⊚ |
| Example 4 | KrF resist | 0.70 | 0.75 | 0.34 | 0.36 | ⊚ |
| Comparative Example 1 | i-line resist | 1.00 | 1.00 | 0.52 | 0.48 | ○ |
| Comparative Example 2 | KrF resist | 0.70 | 0.70 | 0.14 | 0.56 | ○ |

*[Initial value of Resist film thickness] - [Remaining film thickness after etching]
**The state of section form of an oxidized film on a substrate after etching is shown

EFFECTIVENESS OF INVENTION

As mentioned above in detail, in the present invention, etching resistance of a resist mask can be improved by forming an etching protection layer on a resist pattern, which is formed by the method so far applied, using a composition for forming an etching protection layer, thereby etching condition can be made severe, a good pattern can be transferred on a substrate in a shorter time. Because of this, semiconductor integrated circuits etc. can be manufactured at high yield and in shorter time in the present invention.

INDUSTRIAL APPLICABILITY

The etching method of the present invention is used as a suitable method when manufacturing a semiconductor device, formation of a liquid crystal display device of liquid crystal display (LCD) panel, manufacturing a circuit substrate such as a thermal head. In these methods, etching resistance of the resist mask is improved by using the composition for an etching protection layer of the present invention.

What is claimed is:

1. A method of etching a substrate, which comprises the steps of:

forming a resist pattern on a substrate by use of a photoresist, applying a composition for forming an etching protection layer on the resist pattern formed, forming an etching protection layer insoluble in a developer containing water in the interface between the composition for forming an etching protection layer and the resist, removing unnecessary parts other than the etching protection layer of the composition for forming an etching protection layer by the water-containing developer, and etching the substrate by using, as a mask, the resist pattern having the etching protection layer thereon, wherein the above-described composition for forming an etching protection layer comprises at least one water-soluble or water-dispersible resin comprising a copolymer of at least one monomer selected from the group consisting of acrylic acid, methacrylic acid, vinyl acetal, vinyl alcohol, ethylene imine, vinyl amine, allyl amine, methacyl amine and vinyl methyl ether and at least one monomer selected from the group consisting of a styrene derivative selected from the group consisting of hydroxystyrene, 4-methylstyrene, 4-ethylstyrene, p-isopropylstyrene, 4-butylstyrene, 4-hexylstyrene, 4-methoxystyrene, 4-ethoxystyrene, 4-propoxystyrene, 4-butoxystyrene, 4-butoxymethylstyrene, 4-butoxycarbonylstyrene, 2,5-dimethylstyrene, 2,4,5-trimethyistyrene, 4-phenylstyrene, 4-fluorostyrene, 2,5-difluorostyrene, 2,4-difluorostyrene, o-chlorostyrene, 4-acetylstyrene, 4-bezoylstyrene, 4-bromostyrene, aminostyrene, vinyl benzoic acid, vinyl benzoic esters and α-methylstyrene, a polycyclic aromatic vinyl compound, a heterocyclic vinyl compound; a crosslinking agent and water and/or a water-soluble organic solvent as a solvent.

2. The method of etching a substrate according to claim 1, wherein the etching protection layer is formed by heating the resist pattern and the composition for forming an etching protection layer.

3. The method of etching a substrate according to claim 1, wherein the etching protection layer is formed by crosslinking the etching composition for forming an etching protection layer by an acid contained in the vicinity of the surface in the resist.

4. The method of etching a substrate according to claim 1, wherein the water-containing developer consists of water.

5. The method of etching a substrate according to claim 1, wherein the water-containing developer consists of a mixture of water and alcohol.

6. The composition for forming an etching protection layer used in the method of etching a substrate according to claim 1, which comprises at least one of water-soluble or water-dispersible resin comprising a copolymer of at least one monomer selected from the group consisting of acrylic acid, methacrylic acid, vinyl acetal, vinyl alcohol, ethylene imine, vinyl amine, allyl amine, methacyl amine and vinyl methyl ether and at least one monomer selected from the group consisting of styrene, a styrene derivative, a polycyclic aromatic vinyl compound, a heterocyclic vinyl compound, a crosslinking agent, and water and/or a water-soluble organic solvent as a solvent.

7. The composition for forming an etching protection layer according to claim 1, wherein the water-soluble or water-dispersible resin is either at least one resin selected from the group consisting of water-soluble novolak resin and water-soluble or water-dispersible resin consisting of a copolymer between at least one monomer selected from the group consisting of acrylic acid, methacrylic acid, vinyl acetal, vinyl alcohol, vinyl pyrrolidone, ethylene imine, vinyl amine, allyl amine, methacryl amine and vinyl methyl ether and at least one monomer selected from the group consisting of styrene, a styrene derivative, a polycyclic aromatic vinyl compound and a heterocyclic vinyl compound, or a mixture of at least one of these resins and at least one member selected from the group consisting of oxazoline group-containing water-soluble resin, water-soluble melamine resin, water-soluble urea resin, alkyd resin and sulfonamide.

8. The composition for forming an etching protection layer according to claim 6, wherein the water-soluble crosslinking agent is at least one member selected from the group consisting of a melamine derivative, an urea derivative, benzoguanamine and glycol uril.

9. The composition for forming an etching protection layer according to claim 6, wherein the water-soluble organic solvent is at least one member selected from the group consisting of $C_{1-4}$ fatty alcohol, propylene glycol monoethyl ether, lactate, ethyl acetate and N-methyl pyrrolidone.

10. The method of etching a substrate according to claim 2, wherein the etching protection layer is formed by crosslinking the etching composition for forming an etching protection layer by an acid contained in the vicinity of the surface in the resist.

11. The method of etching a substrate according to claim 2, wherein the water-containing developer consists of water.

12. The method of etching a substrate according to claim 3, wherein the water-containing developer consists of water.

13. The method of etching a substrate according to claim 2, wherein the water-containing developer consists of a mixture of water and alcohol.

14. The method of etching a substrate according to claim 3, wherein the water-containing developer consists of a mixture of water and alcohol.

15. The composition for forming an etching protection layer according to claim 7, wherein the water-soluble crosslinking agent is at least one member selected from the group consisting of a melamine derivative, an urea derivative, benzoguanamine and glycol uril.

16. The composition for forming an etching protection layer according to claim 7, wherein the water-soluble organic solvent is at least one member selected from the group consisting of $C_{1-4}$ fatty alcohol, propylene glycol monoethyl ether, lactate, ethyl acetate and N-methyl pyrrolidone.

17. The composition for forming an etching protection layer according to claim 8, wherein the water-soluble organic solvent is at least one member selected from the group consisting of $C_{1-4}$ fatty alcohol, propylene glycol monoethyl ether, lactate, ethyl acetate and N-methyl pyrrolidone.

* * * * *